United States Patent
Lei et al.

(10) Patent No.: US 10,123,465 B2
(45) Date of Patent: Nov. 6, 2018

(54) POWER-MODULE ASSEMBLY

(71) Applicant: Ford Global Technologies, LLC, Dearborn, MI (US)

(72) Inventors: Guangyin Lei, Dearborn Heights, MI (US); Michael W. Degner, Novi, MI (US); Edward Chan-Jiun Jih, Troy, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 626 days.

(21) Appl. No.: 14/687,468

(22) Filed: Apr. 15, 2015

(65) Prior Publication Data
US 2016/0309622 A1 Oct. 20, 2016

(51) Int. Cl.
*H05K 7/20* (2006.01)
*H05K 7/14* (2006.01)

(52) U.S. Cl.
CPC ....... *H05K 7/20927* (2013.01); *H05K 7/1432* (2013.01)

(58) Field of Classification Search
CPC ........... Y10T 29/4935; Y10T 29/49227; Y10T 29/49126; Y10T 29/49128; Y10T 29/49158; H05K 7/1427; H05K 7/1428–7/1434; H05K 7/2089–7/20945; H05K 7/1432; H05K 7/20927
USPC ..................................... 29/592.1, 623, 623.1
See application file for complete search history.

(56) References Cited

U.S. PATENT DOCUMENTS

| | | | | |
|---|---|---|---|---|
| 4,025,996 A * | 5/1977 | Saveker | ................. | B21D 47/00 244/123.1 |
| 4,718,163 A * | 1/1988 | Berland | ............... | H05K 1/0272 174/16.3 |
| 5,269,999 A * | 12/1993 | Smesny | ................. | B29C 43/18 264/112 |
| 5,526,231 A * | 6/1996 | Arz | ..................... | F28D 20/0039 257/E23.098 |
| 5,958,550 A * | 9/1999 | Childress | ................ | B29C 70/24 428/119 |
| 7,245,493 B2 * | 7/2007 | Inagaki | ............... | H01L 23/4334 174/15.1 |
| 7,835,151 B2 | 11/2010 | Olesen | | |
| 8,248,809 B2 | 8/2012 | Miller et al. | | |
| 8,421,235 B2 * | 4/2013 | Ide | ........................ | H01L 23/473 257/675 |
| 8,530,281 B2 * | 9/2013 | Noritake | ............... | H01L 21/565 257/E21.499 |

(Continued)

OTHER PUBLICATIONS

Products for Electric and Hybrid Vehicles, Mar. 25, 2015, 13 pgs.

*Primary Examiner* — Peter DungBa Vo
*Assistant Examiner* — Kaying Kue
(74) *Attorney, Agent, or Firm* — David B. Kelley; Brooks Kushman P.C.

(57) ABSTRACT

A method of forming a power-module assembly includes arranging power stages in a cavity of a container such that the power stages are spaced apart from walls of the container. The method further includes inserting a core between each of the power stages, and installing a manifold on top of the power stages. The method also includes putting resin into the cavity to form a housing of the power-module assembly, and removing the core to reveal coolant chambers between each of the power stages.

18 Claims, 9 Drawing Sheets

(56) References Cited

U.S. PATENT DOCUMENTS

| | | | | |
|---|---|---|---|---|
| 8,537,551 B2* | 9/2013 | Ide | ......................... | H01L 23/473 |
| | | | | 257/706 |
| 9,072,197 B2* | 6/2015 | Murata | .............. | H05K 7/20236 |
| 9,538,691 B2* | 1/2017 | Kikuchi | ............... | H05K 7/2089 |
| 9,848,519 B2* | 12/2017 | Lei | ..................... | H05K 7/20927 |
| 9,867,319 B2* | 1/2018 | Lei | ..................... | H05K 7/20927 |
| 9,950,628 B2* | 4/2018 | Lei | .......................... | B60L 11/02 |
| 9,954,409 B2* | 4/2018 | Lei | ........................ | H02K 11/33 |
| 9,961,808 B2* | 5/2018 | Lei | ........................ | H02M 7/003 |
| 10,014,794 B2* | 7/2018 | Lei | .......................... | B60R 16/03 |
| 2001/0033477 A1* | 10/2001 | Inoue | ................. | H01L 23/4006 |
| | | | | 361/718 |
| 2005/0133210 A1* | 6/2005 | Inagaki | ................ | F28D 1/0333 |
| | | | | 165/152 |
| 2006/0096299 A1* | 5/2006 | Mamitsu | .............. | H01L 23/473 |
| | | | | 62/3.2 |
| 2008/0224303 A1* | 9/2008 | Funakoshi | ............ | H01L 23/051 |
| | | | | 257/701 |
| 2008/0251909 A1 | 10/2008 | Tokuyama et al. | | |
| 2009/0302444 A1* | 12/2009 | Ueda | ..................... | H01L 21/565 |
| | | | | 257/675 |
| 2012/0007254 A1* | 1/2012 | Yang | .................. | H01L 23/4985 |
| | | | | 257/774 |
| 2013/0335920 A1* | 12/2013 | Murata | .............. | H05K 7/20236 |
| | | | | 361/699 |

* cited by examiner

POWER-MODULE ASSEMBLY

TECHNICAL FIELD

The present disclosure relates to power inverters for automotive vehicles.

BACKGROUND

Vehicles such as battery-electric vehicles (BEVs), plug-in hybrid-electric vehicles (PHEVs) and fully hybrid-electric vehicles (FHEVs) contain a traction battery assembly to act as an energy source for one or more electric machines. The traction battery includes components and systems to assist in managing vehicle performance and operations. A power inverter is electrically connected between the battery and the electric machines to convert the direct current coming from the battery into alternating current compatible with the electric machines. The power inverter may also act as a rectifier to convert alternating current from the electric machines to direct current compatible with the battery.

SUMMARY

According to one embodiment, a method of forming a power-module assembly includes arranging power stages in a cavity of a container such that the power stages are spaced apart from walls of the container. The method further includes inserting a core between each of the power stages, and installing a manifold on top of the power stages. The method also includes putting resin into the cavity to form a housing of the power-module assembly, and removing the core to reveal coolant chambers between each of the power stages.

According to another embodiment, a method of forming a power-module assembly for an automotive power inverter includes arranging a plurality of power stages in a mold cavity of a container such that the power stages are in a linear array with spacing between each of the power stages, and such that the power stages are spaced apart from walls of the container. The method further includes inserting a core into the cavity such that fingers of the core are disposed in the spacing between the power stages. The method also includes inserting a manifold into the cavity such that the manifold is disposed on a top of each of the power stages. The method further includes pouring resin into the cavity to form at least a portion of a housing of the power-module assembly. The method also includes removing the core to reveal a plurality of chambers between each of the power stages.

According to yet another embodiment, a method of forming a power-module assembly includes arranging power stages in a mold cavity such that the power stages are spaced apart from walls of the cavity. The method further includes inserting a coolant device between each of the power stages and installing a manifold on top of the power stages and coolant devices such that the devices are in fluid communication with the manifold. The method also includes putting resin into the cavity to form a housing of the power-module assembly.

According to another embodiment, a power-module assembly includes a plurality of power stages and a housing. The housing is formed by the process of arranging power stages in a cavity of a container such that the power stages are spaced apart from walls of the container and inserting a core between each of the power stages. The process further includes pouring resin into the cavity to form the housing and removing the core to reveal coolant chambers between each of the power stages.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
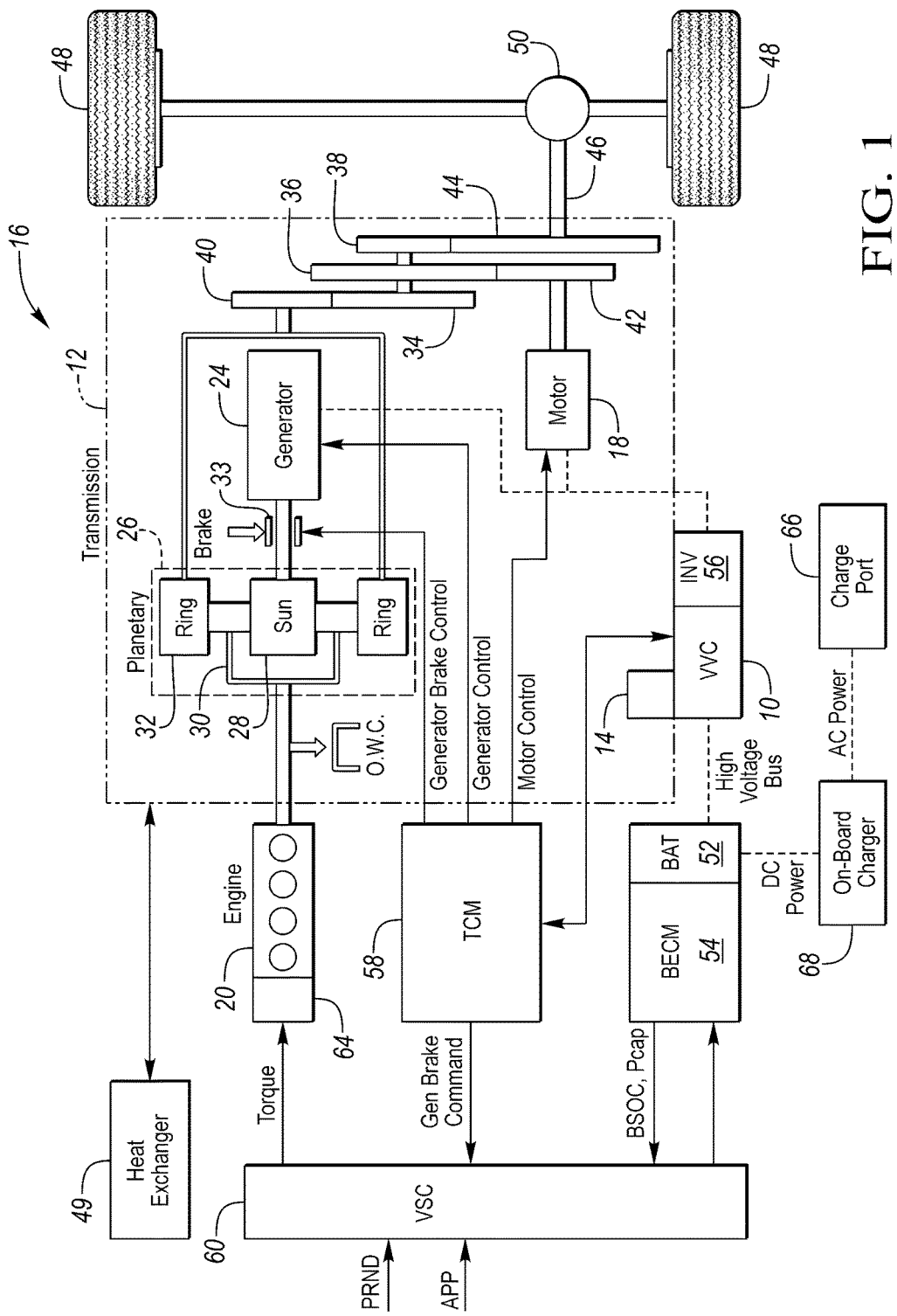
FIG. 1 is a schematic diagram of an example hybrid vehicle.

An example of a PHEV is depicted in FIG. 1 and referred to generally as a vehicle 16. The vehicle 16 includes a transmission 12 and is propelled by at least one electric machine 18 with assistance from an internal combustion engine 20. The electric machine 18 may be an AC electric motor depicted as "motor" 18 in FIG. 1. The electric machine 18 receives electrical power and provides torque for vehicle propulsion. The electric machine 18 also functions as a generator for converting mechanical power into electrical power through regenerative braking.

The transmission 12 may be a power-split configuration. The transmission 12 includes the first electric machine 18 and a second electric machine 24. The second electric machine 24 may be an AC electric motor depicted as "generator" 24 in FIG. 1. Like the first electric machine 18, the second electric machine 24 receives electrical power and provides output torque. The second electric machine 24 also functions as a generator for converting mechanical power into electrical power and optimizing power flow through the transmission 12. In other embodiments, the transmission does not have a power-split configuration.

The transmission 12 includes a planetary gear unit 26, which includes a sun gear 28, a planet carrier 30 and a ring gear 32. The sun gear 28 is connected to an output shaft of the second electric machine 24 for receiving generator torque. The planet carrier 30 is connected to an output shaft of the engine 20 for receiving engine torque. The planetary gear unit 26 combines the generator torque and the engine torque and provides a combined output torque about the ring gear 32. The planetary gear unit 26 functions as a continuously variable transmission, without any fixed or "step" ratios.

The transmission 12 may also include a one-way clutch (O.W.C.) and a generator brake 33. The O.W.C. is coupled to the output shaft of the engine 20 to only allow the output shaft to rotate in one direction. The O.W.C. prevents the transmission 12 from back-driving the engine 20. The generator brake 33 is coupled to the output shaft of the second electric machine 24. The generator brake 33 may be activated to "brake" or prevent rotation of the output shaft of the second electric machine 24 and of the sun gear 28. Alternatively, the O.W.C. and the generator brake 33 may be eliminated and replaced by control strategies for the engine 20 and the second electric machine 24.

The transmission 12 includes a countershaft having intermediate gears including a first gear 34, a second gear 36 and a third gear 38. A planetary output gear 40 is connected to the ring gear 32. The planetary output gear 40 meshes with the first gear 34 for transferring torque between the planetary gear unit 26 and the countershaft. An output gear 42 is connected to an output shaft of the first electric machine 18. The output gear 42 meshes with the second gear 36 for transferring torque between the first electric machine 18 and the countershaft. A transmission output gear 44 is connected to a driveshaft 46. The driveshaft 46 is coupled to a pair of driven wheels 48 through a differential 50. The transmission output gear 44 meshes with the third gear 38 for transferring torque between the transmission 12 and the driven wheels 48. The transmission also includes a heat exchanger or automatic transmission fluid cooler 49 for cooling the transmission fluid.

The vehicle 16 includes an energy storage device, such as a traction battery 52 for storing electrical energy. The battery 52 is a high voltage battery that is capable of outputting electrical power to operate the first electric machine 18 and the second electric machine 24. The battery 52 also receives electrical power from the first electric machine 18 and the second electric machine 24 when they are operating as generators. The battery 52 is a battery pack made up of several battery modules (not shown), where each battery module contains a plurality of battery cells (not shown). Other embodiments of the vehicle 16 contemplate different types of energy storage devices, such as capacitors and fuel cells (not shown) that supplement or replace the battery 52. A high voltage bus electrically connects the battery 52 to the first electric machine 18 and to the second electric machine 24.

The vehicle includes a battery energy control module (BECM) 54 for controlling the battery 52. The BECM 54 receives input that is indicative of vehicle conditions and battery conditions, such as battery temperature, voltage and current. The BECM 54 calculates and estimates battery parameters, such as battery state of charge and the battery power capability. The BECM 54 provides output (BSOC, $P_{cap}$) that is indicative of a battery state of charge (BSOC) and a battery power capability ($P_{cap}$) to other vehicle systems and controllers.

The vehicle 16 includes a DC-DC converter or variable voltage converter (VVC) 10 and an inverter 56. The VVC 10 and the inverter 56 are electrically connected between the traction battery 52 and the first electric machine 18, and between the battery 52 and the second electric machine 24. The VVC 10 "boosts" or increases the voltage potential of the electrical power provided by the battery 52. The VVC 10 also "bucks" or decreases the voltage potential of the electrical power provided to the battery 52, according to one or more embodiments. The inverter 56 inverts the DC power supplied by the main battery 52 (through the VVC 10) to AC power for operating the electric machines 18, 24. The inverter 56 also rectifies AC power provided by the electric machines 18, 24, to DC for charging the traction battery 52. Other embodiments of the transmission 12 include multiple inverters (not shown), such as one invertor associated with each electric machine 18, 24. The VVC 10 includes an inductor assembly 14.

The transmission 12 includes a transmission control module (TCM) 58 for controlling the electric machines 18, 24, the VVC 10 and the inverter 56. The TCM 58 is configured to monitor, among other things, the position, speed, and power consumption of the electric machines 18, 24. The TCM 58 also monitors electrical parameters (e.g., voltage and current) at various locations within the VVC 10 and the inverter 56. The TCM 58 provides output signals corresponding to this information to other vehicle systems.

The vehicle 16 includes a vehicle system controller (VSC) 60 that communicates with other vehicle systems and controllers for coordinating their function. Although it is shown as a single controller, the VSC 60 may include multiple controllers that may be used to control multiple vehicle systems according to an overall vehicle control logic, or software.

The vehicle controllers, including the VSC 60 and the TCM 58 generally includes any number of microprocessors, ASICs, ICs, memory (e.g., FLASH, ROM, RAM, EPROM and/or EEPROM) and software code to co-act with one another to perform a series of operations. The controllers also include predetermined data, or "look up tables" that are based on calculations and test data and stored within the memory. The VSC 60 communicates with other vehicle systems and controllers (e.g., the BECM 54 and the TCM 58) over one or more wired or wireless vehicle connections using common bus protocols (e.g., CAN and LIN). The VSC 60 receives input (PRND) that represents a current position of the transmission 12 (e.g., park, reverse, neutral or drive). The VSC 60 also receives input (APP) that represents an accelerator pedal position. The VSC 60 provides output that represents a desired wheel torque, desired engine speed, and generator brake command to the TCM 58; and contactor control to the BECM 54.

The vehicle 16 includes an engine control module (ECM) 64 for controlling the engine 20. The VSC 60 provides output (desired engine torque) to the ECM 64 that is based on a number of input signals including APP, and corresponds to a driver's request for vehicle propulsion.

If the vehicle 16 is a PHEV, the battery 52 may periodically receive AC energy from an external power supply or grid, via a charge port 66. The vehicle 16 also includes an on-board charger 68, which receives the AC energy from the charge port 66. The charger 68 is an AC/DC converter which converts the received AC energy into DC energy suitable for charging the battery 52. In turn, the charger 68 supplies the DC energy to the battery 52 during recharging. Although illustrated and described in the context of a PHEV 16, it is understood that the inverter 56 may be implemented on other types of electric vehicles, such as a HEV or a BEV.

Figure 2:
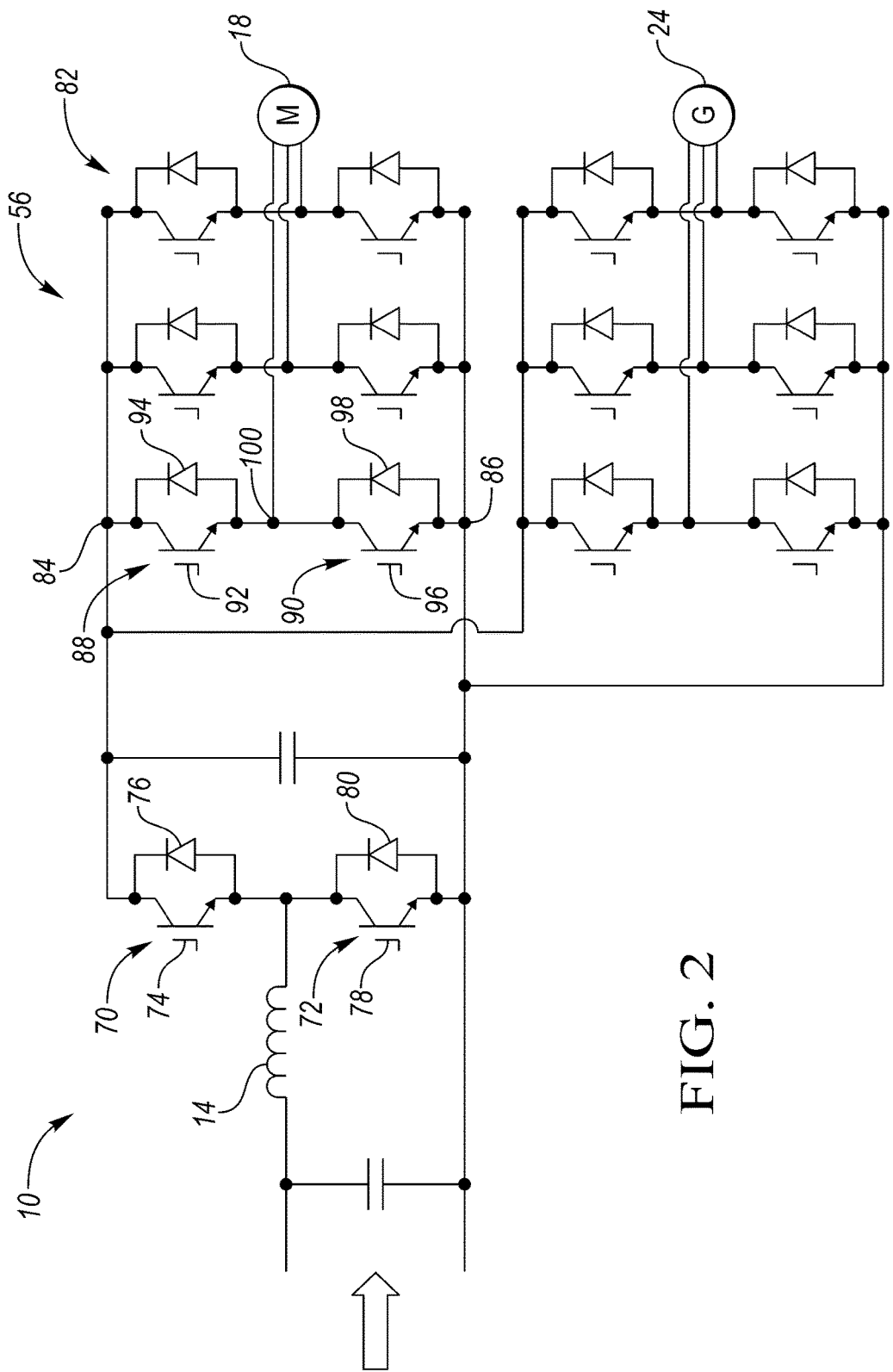
FIG. 2 is a schematic diagram of a variable voltage converter and a power inverter.

Referring to FIG. 2, an electrical schematic of the VVC 10 and the inverter 56 is shown. The VVC 10 may include a first switching unit 70 and a second switching unit 72 for boosting the input voltage ($V_{bat}$) to provide output voltage (KO. The first switching unit 70 may include a first transistor 74 connected in parallel to a first diode 76, but with their polarities switched (anti-parallel). The second switching unit 72 may include a second transistor 78 connected anti-parallel to a second diode 80. Each transistor 74, 78 may be any type of controllable switch (e.g., an insulated gate bipolar transistor (IGBT) or field-effect transistor (FET)). Additionally, each transistor 74, 78 may be individually controlled by the TCM 58. The inductor assembly 14 is depicted as an input inductor that is connected in series between the traction battery 52 and the switching units 70, 72. The inductor 14 generates magnetic flux when a current is supplied. When the current flowing through the inductor 14 changes, a time-varying magnetic field is created, and a voltage is induced. Other embodiments of the VVC 10 include alternative circuit configurations (e.g., more than two switches).

The inverter 56 may include a plurality of half-bridges 82 that are stacked in an assembly. Each of the half-bridges may be packaged as a power stage. In the illustrated embodiment, the inverter 56 includes six half-bridges, three for the motor 18 and three for the generator 24. Each of the half bridges 82 may include a positive DC lead 84 that is coupled to a positive DC node from the battery and a negative DC lead 86 that is coupled to a negative DC node from the battery. Each of the half bridges 82 may also include a first switching unit 88 and a second switching unit 90. The first switching unit 88 may include a first transistor 92 connected in parallel to a first diode 94. The second switching unit 90 may include a second transistor 96 connected in parallel to a second diode 98. The first and second transistors 88, 96 may be IGBTs or FETs. The first and second switching units 88, 90 of the each of the half-bridges 82 convert the DC power of the battery into a single phase AC output at the AC lead 100. Each of the AC leads 100 are electrically connected to the motor 18 or generator 24. In the illustrated example, three of the AC leads 100 are electrically connected to the motor 18 and the other three AC leads 100 are electrically connected to the generator 24.

Figure 3:
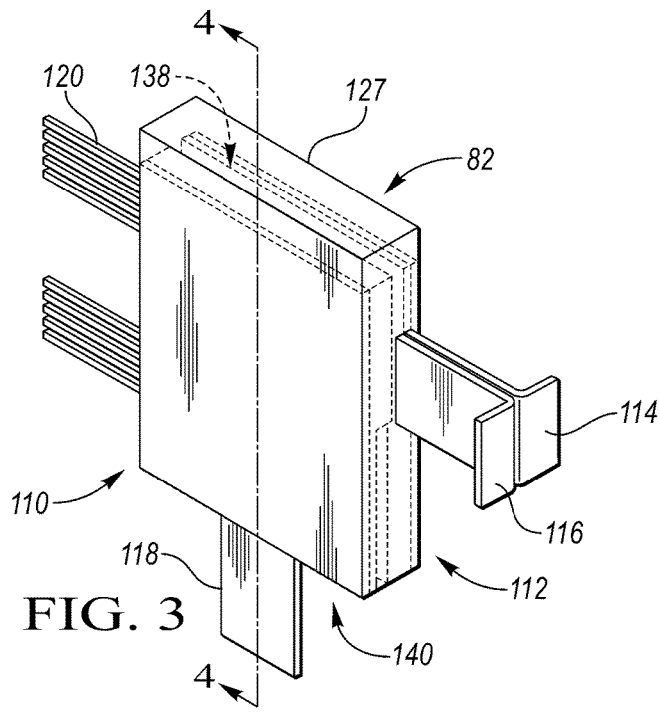
FIG. 3 is a perspective view of a power stage.
Figure 4:
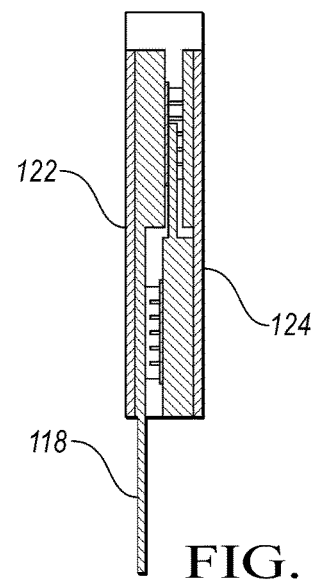
FIG. 4 is a side view, in cross-section, of the power stage of FIG. 3 along cut line 4-4.

Referring to FIGS. 3 and 4 each of the half-bridges 82 may be packaged as a power stage. Each of the power stages 82 includes opposing major sides 110, opposing minor sides 112, a top 138, and a bottom 140. The power stage 82 includes a positive DC power terminal 114, a negative DC power terminal 116, an AC power terminal 118, and signal pins 120 that are each electrically connected with one at least one semiconductor device of the power stage 82. The location of the terminals and signal pins may vary by embodiment and are not limited to the configuration shown.

A first plate 122 is disposed on one of the major sides 110 and a second plate 124 is disposed on the other major side of the power stage 82. The plates 122, 124 may be metallic, plastic, composite, or a combination thereof. The semiconductor devices of the power stage 82 may be filled with an epoxy 127 or other filler to electrically isolate the semiconductor devices from the plates and other components. Note: the epoxy is not cross-hatched for clarity.

Figure 5:
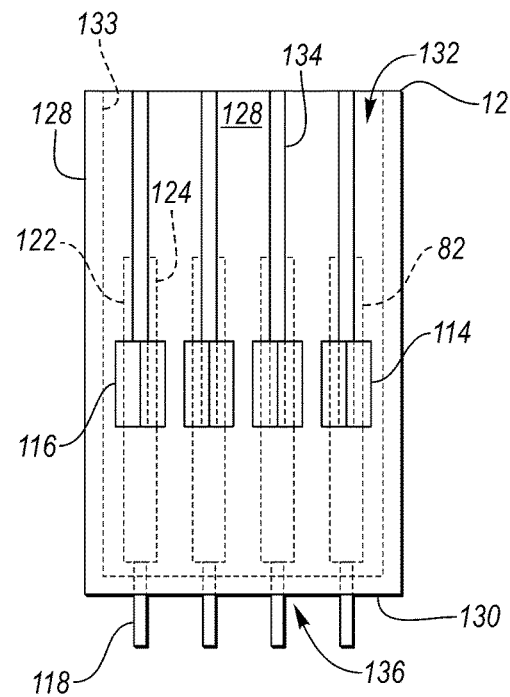
FIG. 5 is a side view of a mold die with the power stages arranged in the mold cavity.
Figure 6:
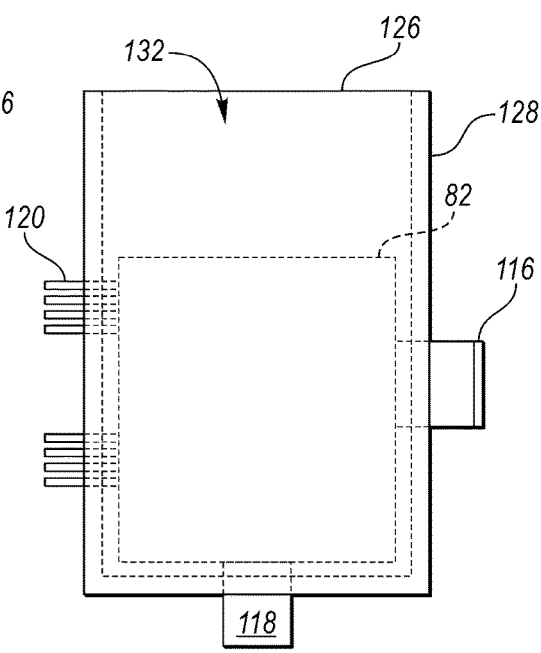
FIG. 6 is a front view of the mold die of FIG. 5.
Figure 7:
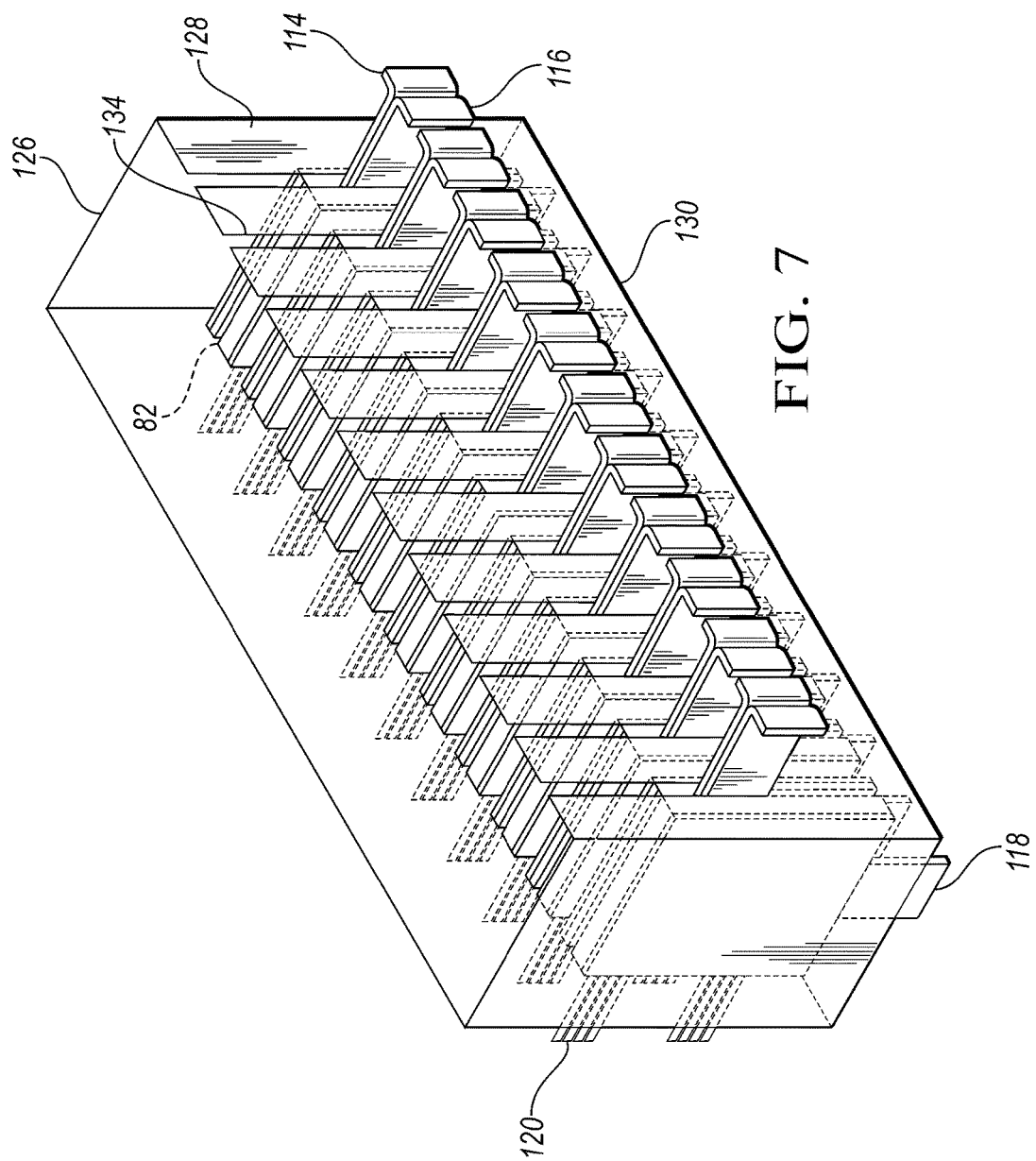
FIG. 7 is a perspective view of the mold die of FIGS. 5 and 6.

The power stages 82 may be arranged in a stack forming a power-module assembly. The power-module assembly may be formed by molding a housing around the power stages. Referring to FIGS. 5, 6, and 7, a container 126 includes walls 128 and a bottom 130 that cooperate to define a mold cavity 132. Each of the power stages 82 are arranged within the mold cavity 132 such that the power stages 82 are spaced apart from each other and are spaced apart from the interior surfaces 133 of the cavity 132. The spaces between the power stages 82 and the cavity 132 are subsequently filled with resin to create the housing. The power stages 82 are arranged with the plates 122, 124 of adjacent power stages 82 facing each other. The mold cavity 132 may include slots or holes allowing the terminals (114, 116, and 118) and signal pins 120 to extend out of the mold cavity 132. For example, the sidewall 128 may define slots 134 that receive the positive and negative DC terminals 114, 116, and the bottom 130 may define slots 136 for receiving the AC terminals 118. The slots and holes may act as alignment features to properly position each of the power stages 82 within the die cavity 132. Note: the power stages 82 in FIGS. 5 and 6 are illustrated in a simplified form. The container 126 may be die that is part of tool, or may simply be an open box.

Figure 8A:
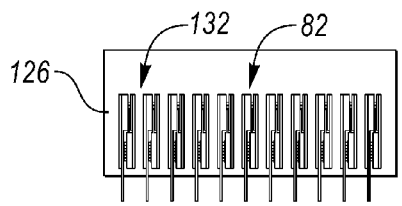
FIGS. 8A to 8E illustrate a sequence of operations for manufacturing a power-module assembly according to one embodiment of this disclosure.
Figure 8B:
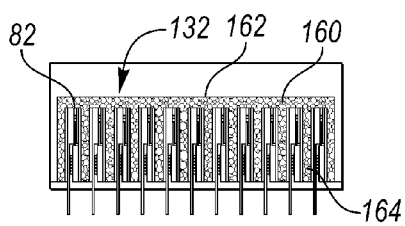
Figure 8C:
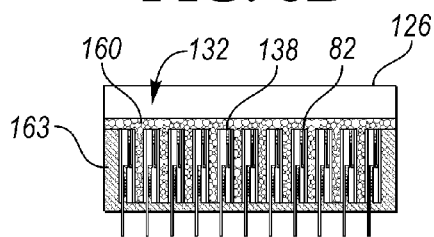
Figure 8D:
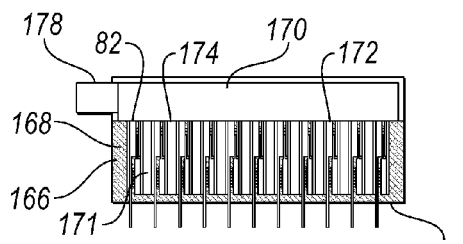
Figure 8E:
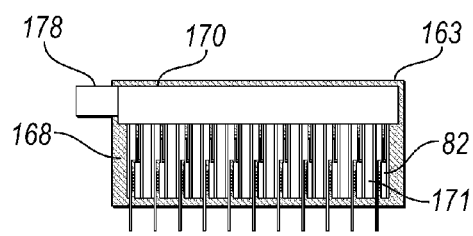
Figure 9:
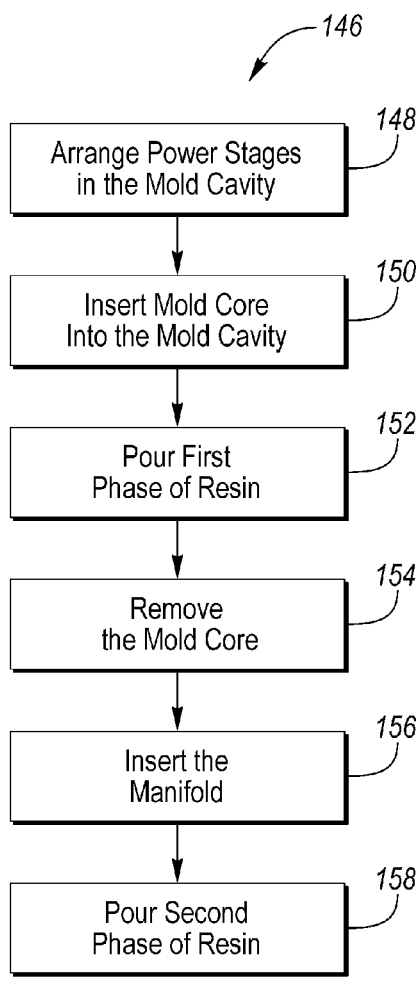
FIG. 9 is a flow chart for manufacturing the power-module assembly from FIGS. 8A to 8E.

FIGS. 8A to 8E illustrate a sequence of operations for manufacturing a power-module assembly according to the flowchart 146 shown in FIG. 9. At operation 148 the power stages 82 are arranged within the mold cavity 132 as described above and as shown in FIG. 8A. In some embodiments the container 126 is part of the finished product. In other embodiments the container is a component of the tooling and is not part of the finished product. At operation 150 a mold core 160 is inserted into the mold cavity 132 as shown in FIG. 8B. The mold core 160 may include a planar top portion 162 disposed on top of each of the power stages 82, and fingers 164 disposed between adjacent power stages 82. The mold core 160 displaces volume within the mold cavity to create internal cavities within the power-module assembly. The mold core may be made out of extruded polystyrene foam (e.g. Styrofoam®), sugar, salt, sand, or wax.

At operation 152 a first phase of resin is poured into the mold cavity 132 as shown in FIG. 8C. In embodiments where the container 126 is not part of the finished product, a release agent may be applied to the cavity walls to prevent the resin from sticking to the container 126. During the first phase, liquid resin 163 may be poured into the mold cavity 132 until the resin rises to the top 138 of the power stages 82. The mold core 160 displaces the resin 163 to create resin free areas, which will become internal cavities in the power-module assembly. After pouring, the container 126 is set aside until the resin cures or hardens. The container 126 may be placed in an oven or other heating process to facilitate curing of the resin. The resin may be an epoxy, or other polymer.

The hardened resin forms a housing 168 that encapsulates the power stages 82 as shown in FIG. 8D. After the resin hardens, the mold core 160 is removed to reveal a plurality of coolant chambers 171 disposed between each of the power stages 82 at operation 154. Each of the coolant chambers 171 are defined by a first plate 122, a second plate 124, a bottom 165 of the housing 168, and sidewalls 166 of the housing 168. The coolant chambers 171 are configured to circulate coolant therein to cool the power stages 82 during operation of the inverter. In some embodiments, a flow guide assembly may be inserted into each of the coolant chambers 171. The flow guides may include fins to facilitate coolant circulation within the chambers 171. The core 160 may be removed by pouring a solvent into the cavity 132 to dissolve the core 160. The method used to remove the core will depend on the type of core used.

At operation 156 a manifold 170 is disposed on top of the power modules 82 as shown in FIG. 8D. The manifold 170 includes a bottom 172 that defines ports 174. Each of the ports is in fluid communication with one of the coolant chambers 171. The ports 174 may project downwardly from the bottom 172 and extend into the coolant chambers. The manifold 170 includes an inlet (not visible) and an outlet 178. The inlet and outlet may extend through a slot defined in the container 126. The inlet and outlet are configured to connect with supply and return lines to connect the manifold 170 with the coolant system (not shown).

Figure 10A:
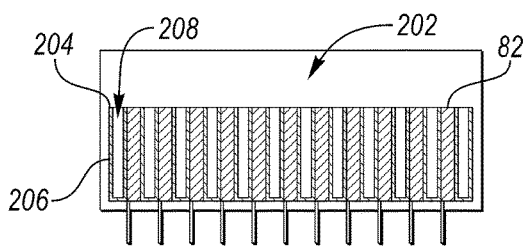
FIGS. 10A to 10D illustrate a sequence of operations for manufacturing a power-module assembly according to another embodiment of this disclosure.

At operation 158 a second phase of resin is poured into the mold cavity 132 as shown in FIG. 8E. During the second phase, liquid resin 163 is poured into the mold cavity 132 until the resin rises to a predetermined height within the cavity 132. The resin from the second phase encapsulates the manifold 170 to form the upper portion of the housing. The resin may be the same type of resin that was used during the first phase. The resin may cure at room temperature or may be placed in an oven depending upon the type of resin used and the desired cure time. After the resin hardens, the power-module assembly may either be removed from the container 126, or remains in the container depending upon the embodiment FIGS. 10A to 10D illustrate a sequence of operations for forming another power-module assembly according to the flowchart 190 show in FIG. 11. At operation 192 the power stages 82 are arranged within the mold cavity 202 as described above and as shown in FIG. 10A. At operation 194 a plurality of coolant devices 204 are inserted between adjacent power stages 82 as shown in FIG. 10A. Each of the devices 204 includes a housing 206 that defines a coolant chamber 208. The housing 206 may include an open top or may include a top having openings allowing coolant to enter and exit into the coolant chamber 208. Flow guide assemblies may be inserted into the chambers 208 to facilitate cooling.

Figure 10B:
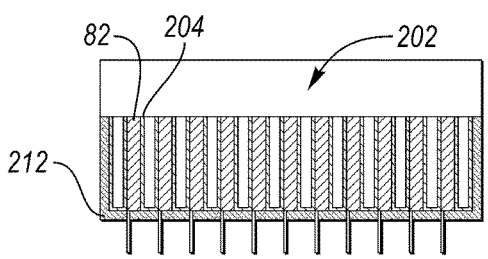
Figure 10C:
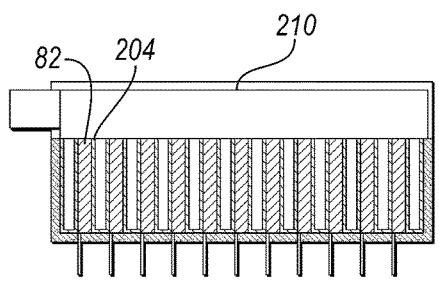

The resin may be poured in a single phase or in multiple phases. For example, at operation 196 a first phase of resin is poured into the mold cavity 202 as shown in FIG. 10B. During the first phase, liquid resin 212 is poured into the mold cavity 202 until the resin rises near the top of the coolant devices 204. The resin may be left to cure at room temperature or placed in a heated environment.

Figure 10D:
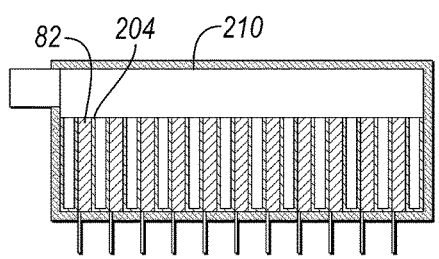

At operation 198 a manifold 210 is disposed on top of the power stages 82 and the coolant devices 204. A bottom of the manifold 210 includes ports that are in fluid communication with each of the coolant chambers 208. After installing the manifold 210, a second phase of resin is poured into the cavity 202 at operation 200 as shown in FIG. 10D. The resin from the second phase encapsulates the manifold 210 to form the upper portion of the power-module assembly. After the resin hardens, the power-module assembly may (or may not) be removed from the container.

Figure 11:
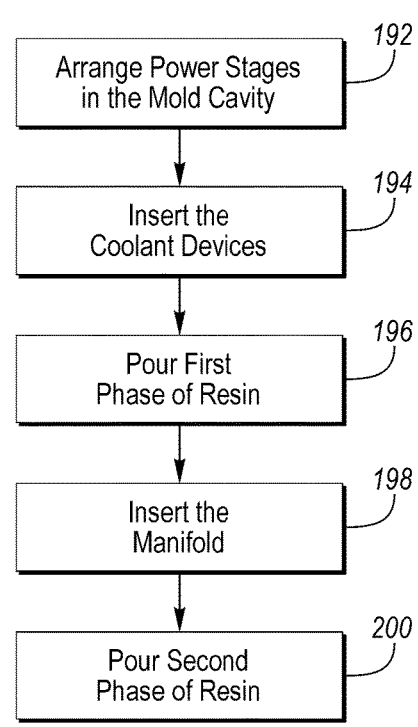
FIG. 11 is a flow chart for manufacturing the power-module assembly from FIGS. 10A to 10D.
Figure 12A:
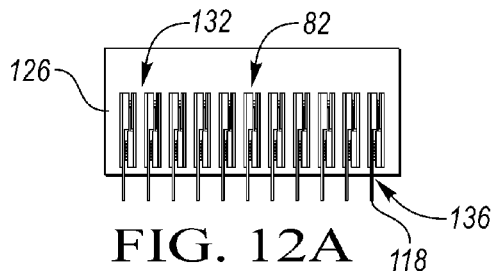
FIGS. 12A to 12D illustrate a sequence of operations for manufacturing a power-module assembly according to yet another embodiment of this disclosure.
Figure 12B:
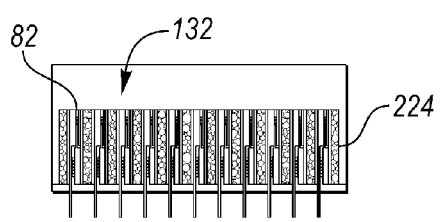
Figure 12C:
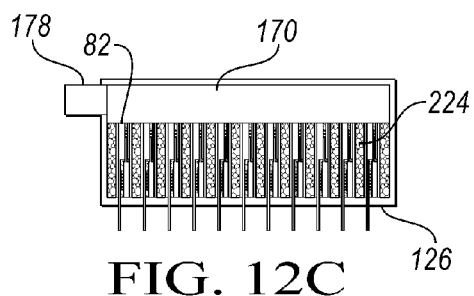
Figure 12D:
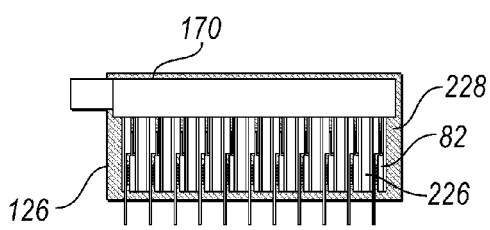
Figure 13:
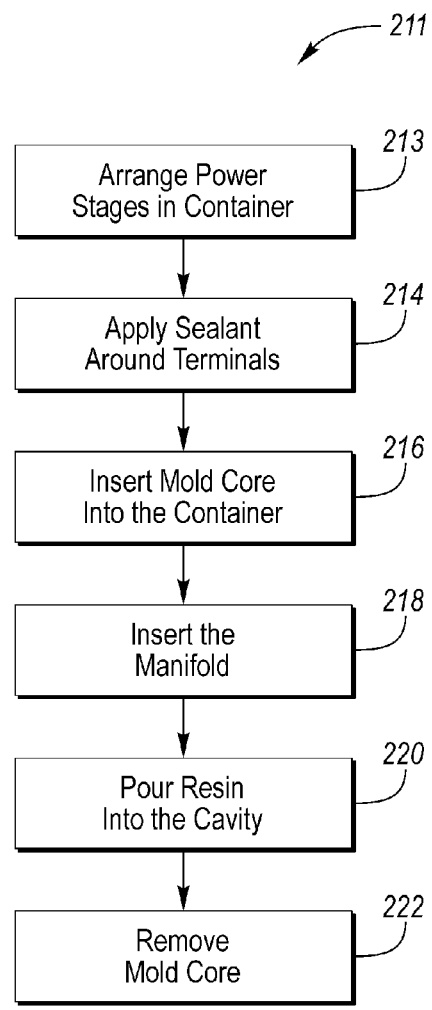
FIG. 13 is a flow chart for manufacturing the power-module assembly from FIGS. 12A to 12D.

FIGS. 12A to 12D illustrate a sequence of operations for forming yet another power-module assembly according to the flowchart 211 show in FIG. 11. At operation 213 the power stages 82 are arranged within a container 126 with the terminals and signal pin extending through openings defined in the walls of the container as shown in FIG. 12A. At operation 214 a sealant is applied around the holes and terminals to seal the cavity 132. For example, a sealant is applied around terminal 118 to seal the opening 136 and prevent leaking of any resin during the molding process. The sealant, for example, may be a silicone or an epoxy that is applied around each of the openings. Alternatively, the container 126 may be dipped in a sealant bath to seal all of the openings. At operation 216 a mold core 224 is inserted between each of the power stages 82 as shown in FIG. 12B. The mold core 224 may be inserted between the power stages 82 after the power stages are arranged in the container 126, or may be arranged between the power stages 82 prior to the power stages 82 being arranged within container 126. At operation 218 the manifold is inserted into the cavity and installed on top of the power stages 82 as shown in FIG. 12C. At operation 220 resin 228 is poured into the cavity 132 and allowed to harden. At operation 222 the mold core 224 is removed to reveal coolant chambers 226 interleaved between the power stages 82 as shown in FIG. 12D.

Flow charts 146, 190, and 211 illustrate methods that utilize a prefabricated manifold. But, in alternative embodiments, the present disclosure contemplates forming the manifold with resin as part of the process. Here, either an additional or modified core is arranged within the cavity prior to pouring of the resin. The core displaces volume that will become the manifold one the core is removed. After the resin is poured and set, the core is removed to reveal the manifold.

Figure 14:
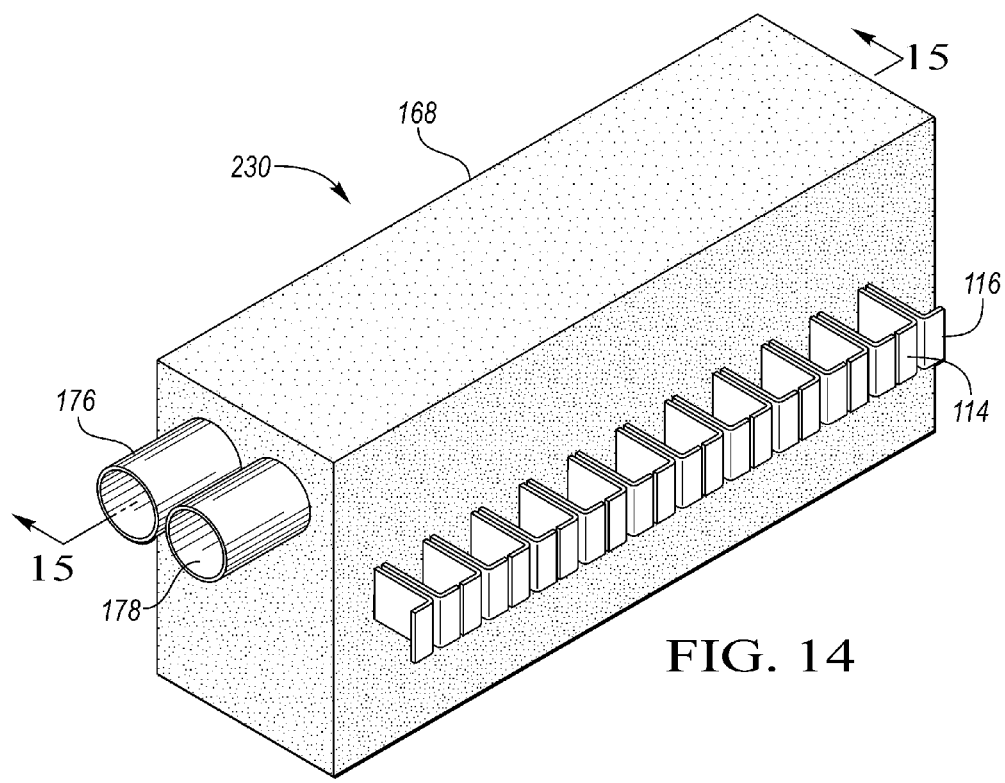
FIG. 14 is a perspective view of a power-module assembly.
Figure 15:
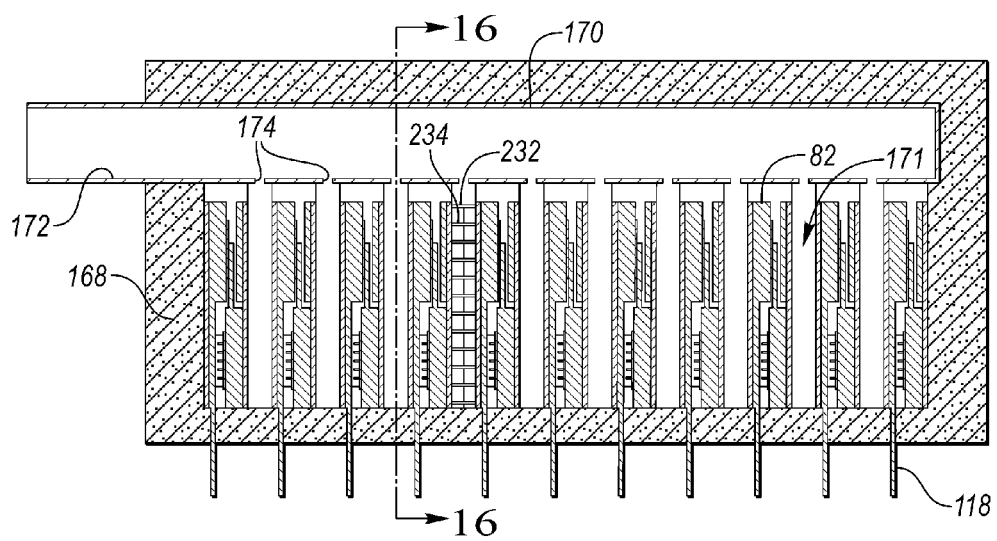
FIG. 15 is a side view, in cross-section, of the power-module assembly of FIG. 14 along cut line 15-15.
Figure 16:
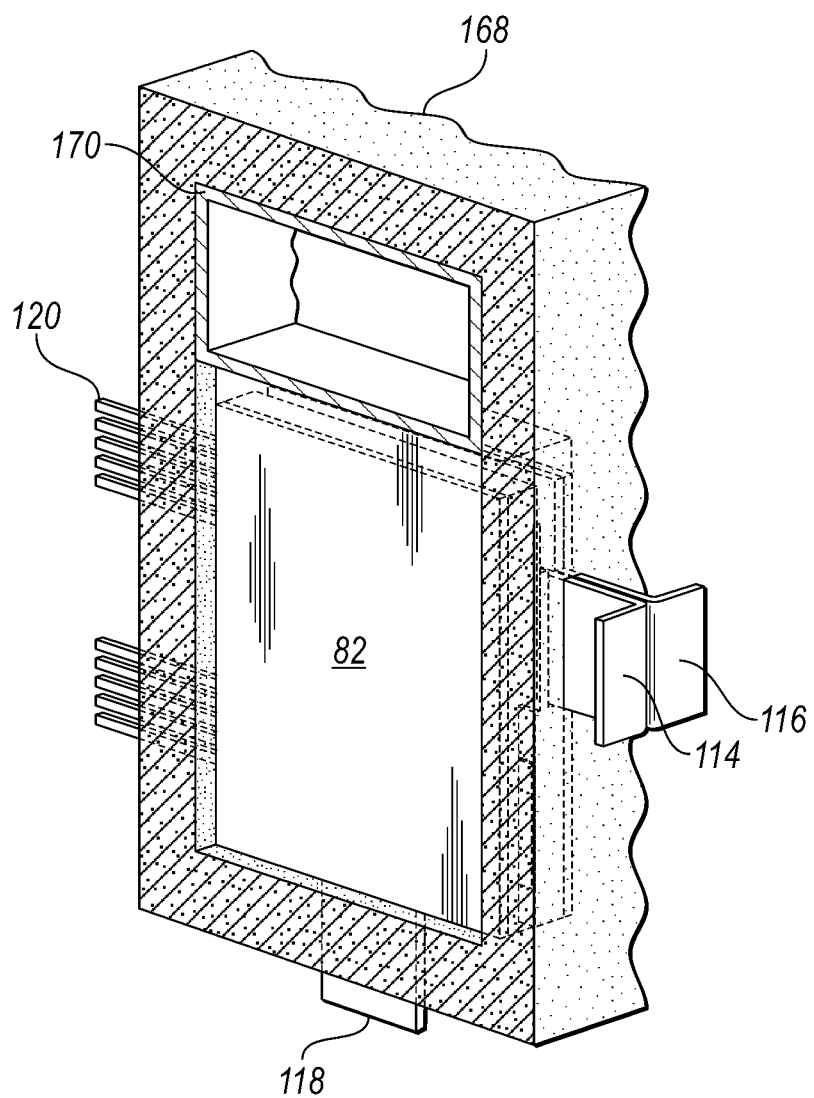
FIG. 16 is a perspective view, in cross-section, of the power-module assembly of FIG. 15 along cut line 16-16.

Referring to FIGS. 14, 15 and 16, a power inverter for a motor vehicle includes a power-module assembly 230, a capacitor module (not shown), and a gate board (not shown). The power-module assembly 230 may be a power-module assembly manufactured according to flowchart 146 for example. The power-module assembly 230 may include a housing 168 formed of hardened resin. In some embodiments, the housing 168 is a combination of hardened resin and the container 126. The housing 168 encapsulates a plurality of power stages 82 and a manifold 170. A plurality of coolant chambers 171 are interleaved with the power stages 82. The manifold 170 is in fluid communication with each of the coolant chambers 171 via the fluid ports 174 that may extend into a respective chamber 171. The inlet stub 176 and the outlet stub 178 of the manifold 170 extend outwardly through the housing 168 so that the manifold can be connected with the coolant circulation system. The positive DC terminals 114 and the negative DC terminals 116 projects outwardly through a side of the housing 168. The DC terminals may be electrically connected to the capacitor module. The AC terminals 118 project outwardly through a bottom of the housing 168 and may be electrically connected to the electric machines 18, 24. The signal pins 120 project outwardly through a side of the housing 168 and may be electrically connected to the gate board.

An optional flow guide assembly 232 may be disposed within one or more of the coolant chambers 171. The flow guide assembly 232 may include fins 234 that direct coolant circulating within the chambers 171.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A method comprising:
    arranging power stages in a cavity of a container such that the power stages are spaced apart from walls of the container;
    inserting a core between each of the power stages;
    putting resin into the cavity, the cores displacing the resin and creating resin-free areas;
    curing the resin to form a power-module housing having chambers created by the resin-free areas, wherein the core is disposed in the chambers;
    removing the core to reveal coolant pockets within the chambers; and
    installing a manifold on top of the power stages, wherein the manifold further includes an inlet stub defining a port, and wherein the manifold is inserted into the cavity such that the inlet stub extends through a wall of the housing.

2. The method of claim 1 wherein each of the power stages further includes semiconductor devices and at least one terminal.

3. The method of claim 2 wherein the power stages are arranged in the container such that the at least one terminal extends through one of the walls of the container.

4. The method of claim 1 wherein removing the core includes dissolving the core with a solvent.

5. The method of claim 1 further comprising inserting a flow guide into each of the coolant pockets.

6. The method of claim 1 wherein the resin is epoxy.

7. The method of claim 1 wherein the power stages are arranged in the cavity in a linear array with spacing between each of the power stages.

8. The method of claim 1 wherein the core includes fingers disposed between adjacent ones of the power stages.

9. The method of claim 1 wherein the resin is poured in two stages.

10. The method of claim 1 wherein the manifold defines openings and the manifold is installed so that the openings are in fluid communication with the coolant chambers.

11. A method of forming a power-module assembly comprising:
    arranging power stages in a cavity of a container such that the power stages are spaced apart from walls of the container;
    inserting a core between each of the power stages;
    putting resin into the cavity such that the cores create resin-free areas;
    curing the resin to form a housing of the power-module assembly;
    removing the core to reveal coolant chambers between each of the power stages;
    installing a manifold on top of the power stages; and
    inserting flow guides with each flow guide being received in one of the chambers, wherein the flow guides are in fluid communication with the manifold.

12. The method of claim 11 wherein removing the core includes dissolving the core with a solvent.

13. A method of forming a power-module assembly comprising:
    arranging power stages in a cavity of a container such that the power stages are spaced apart from walls of the container and from each other;
    inserting a core between each of the power stages;
    putting a first phase of resin into the cavity such that the cores create resin-free areas;
    curing the first phase of resin to form a partial housing of the power-module assembly;
    removing the core to reveal coolant chambers between the power stages;
    installing a manifold, having an inlet stub that defines a port, on top of the power stages; and
    putting a second phase of resin into the cavity such that the second phase of resin hardens to the partial housing to form a complete housing of the power-module assembly, wherein the inlet stub extends through a wall of the complete housing.

14. The method of claim 13 wherein each of the power stages includes semiconductor devices and at least one terminal, and the power stages are arranged in the cavity with the terminals extending through the container.

15. The method of claim 14 further comprising applying sealant on the container around the terminals.

16. The method of claim 13 wherein removing the core includes dissolving the core with a solvent.

17. The method of claim 13 wherein the core includes fingers disposed between adjacent ones of the power stages.

18. The method of claim 13 wherein the second phase of resin in put into the cavity after the manifold is installed.

* * * * *